United States Patent [19]
Ito et al.

[11] Patent Number: 5,344,518
[45] Date of Patent: Sep. 6, 1994

[54] PYROELECTRIC IR-SENSOR

[75] Inventors: Satoru Ito, Machida; Michihiro Murata; Norio Fukui, both of Kyoto; Keizou Yamamoto, Osaka; Tetsujiro Sawao, Himi; Satoshi Awata, Takaoka; Yasuo Tada, Kyoto; Satoru Kawabata, Hikone, all of Japan

[73] Assignee: Murata Manufacturing Co., Ltd., Nagaokakyo, Japan

[21] Appl. No.: 21,371

[22] Filed: Feb. 23, 1993

Related U.S. Application Data

[60] Division of Ser. No. 879,473, May 7, 1992, Pat. No. 5,270,555, which is a continuation-in-part of Ser. No. 689,715, Apr. 22, 1991, abandoned, which is a continuation of Ser. No. 521,512, May 10, 1990, abandoned.

[30] Foreign Application Priority Data

May 18, 1989 [JP] Japan .................................. 1-25568
May 18, 1989 [JP] Japan .................................. 1-25569

[51] Int. Cl.⁵ ............................................ B29C 45/16
[52] U.S. Cl. .................................. 156/242; 156/290; 156/292; 250/338.1; 250/338.3; 257/79; 257/80; 257/81; 257/82; 257/99
[58] Field of Search ................. 156/89, 242, 290, 292; 250/388.1, 338.3; 257/80, 81, 79, 82, 84, 99, 100

[56] References Cited

U.S. PATENT DOCUMENTS 4,682,030  7/1987  Rose et al. ..................... 250/338.3
4,806,763  2/1989  Turnbull ......................... 250/338.3

*Primary Examiner*—Caleb Weston
*Attorney, Agent, or Firm*—Jordan and Hamburg

[57] ABSTRACT

A pyroelectric IR-sensor in which a pyroelectric light receiving element is mounted on a MID substrate or a ceramic substrate having a thermal conductivity less than 0.02 cal/cm.sec.°C. Both ends of the pyroelectric light receiving element are supported by the substrate, with the central portion of the pyroelectric light receiving element being spaced from the substrate. Chip parts are mounted on the substrate.

2 Claims, 4 Drawing Sheets

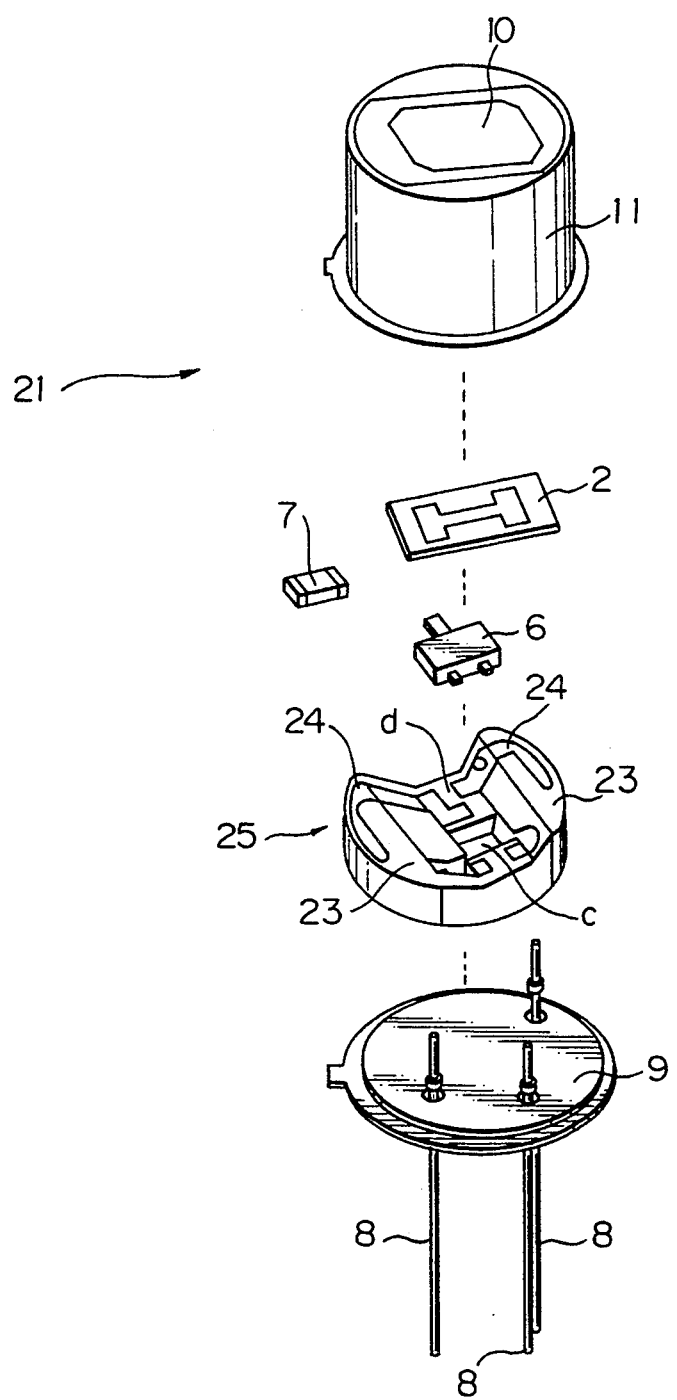

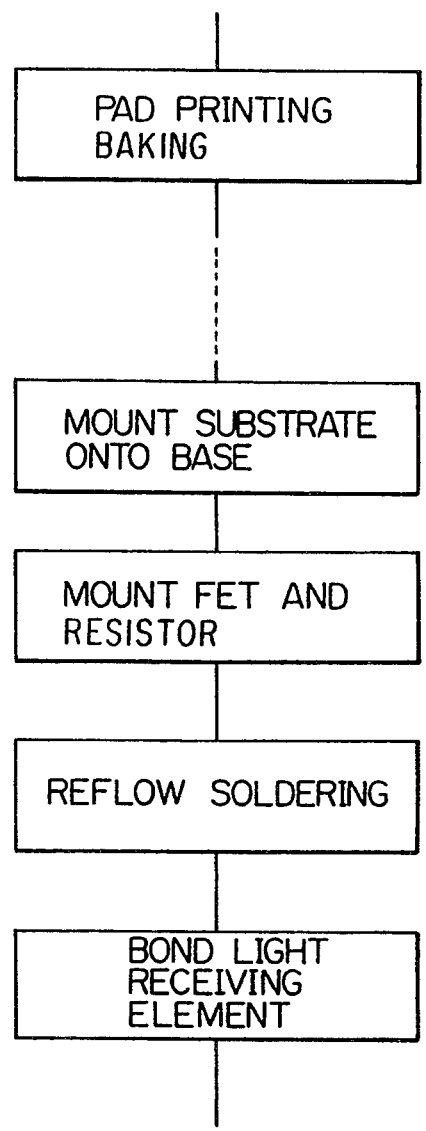

PYROELECTRIC IR-SENSOR

This is a divisional application of U.S. application Ser. No. 879,473, filed on May 7, 1992, now U.S. Pat. No. 5,270,555, which is a continuation-in-part application of U.S. Ser. No. 07/689,712, filed Apr. 22, 1991, abandoned, which is a continuation application of Ser. No. 07/521,512, filed May 10, 1990 (now abandoned).

FIELD OF THE INVENTION

This invention relates to a pyroelectric IR-sensor (infrared sensor), and more particularly to a pyroelectric IR-sensor which has excellent characteristics and is easy to manufacture.

BACKGROUND OF THE INVENTION

A conventional pyroelectric IR-sensor essentially comprises a pyroelectric light receiving element, a substrate or base plate of alumina for supporting the pyroelectric light receiving element in a manner that this pyroelectric light receiving element is spaced from the substrate by spacing pads, and provided with a wiring pattern and a resistor formed on the surface thereof, and an FET chip mounted on the substrate.

The method of manufacturing the above-mentioned pyroelectric IR-sensor will be described hereinafter.

At first, a substrate is provided by forming a wiring pattern and a resistor by silk screen printing and baking on an alumina plate molded in a predetermined shape. Next, a FET chip is soldered onto the substrate. Then, a conductive paste is put on the substrate, the top of the paste is flattened and the paste is suitably hardened to provide spacing pads. Finally, a pyroelectric light receiving element is bonded on the spacing pads.

Since the pyroelectric light receiving element serves to sense changes in temperature in response to infrared rays, this element must be thermally isolated from other components.

To realize this, in the above-described conventional pyroelectric IR-sensor, the pyroelectric light receiving element is spaced from the substrate by the spacing pads and is thus thermally isolated therefrom.

Since heat is transferred through the spacing pads, however, the thermal isolation is insufficient. Further, since it is extremely difficult to form the spacing pads with a high precision, unevenness occurs in the thermal isolation of the pyroelectric light receiving element. This causes unevenness in the characteristics of the pyroelectric light receiving elements. Furthermore, an unbalance occurs in the transfer of heat through the spacing pads which support the pyroelectric light receiving element. This causes the production of noise due to an unbalanced voltage.

In addition, it takes a relatively long time in the process to form the spacing pads. This constitutes an obstacle to improvement in productivity.

SUMMARY OF THE INVENTION

An object of this invention is to provide a pyroelectric IR-sensor which eliminates the above-mentioned problems by employing a structure in which no spacing pad is required.

In the first aspect, this invention provides a pyroelectric IR-sensor comprising a pyroelectric light receiving element, an MID substrate formed to include element supporting portions for supporting both end portions of the pyroelectric light receiving element with the central portion thereof being spaced from the substrate, and chip parts mounted on the MID substrate.

The MID substrate may, for example, be comprised of any of the following materials:
1. Thermoplastic resin with 70% polyester-sulfone resin (PES) and 30% fiberglass
2. Polyestersulfone resin (PES)
3. Polyesterimido resin (PEI)
4. Polysulfone (PSO)
5. Polyarylate (PAR)
6. Liquid crystal polymer (LCP)

The MID substrate in the above-mentioned construction is a substrate of a Molded Inter Connection Device or circuit molding. This substrate is made up or manufactured by a two phase molding process or two shot molding process.

In the above-mentioned pyroelectric IR-sensor, the MID substrate is made of resin having a low thermal conductivity. Further, the pyroelectric light receiving element and the MID substrate are in contact with each other only at both end portions of the pyroelectric light receiving element. Accordingly, even if the pyroelectric light receiving element is directly supported by the element supporting portions of the MID substrate, it can be sufficiently thermally isolated.

As a result, it becomes unnecessary to form a spacing pad and there is no possibility that unevenness in the characteristics or noise due to an unbalanced voltage may occur.

Not only is the process for forming the spacing pads, which requires a relatively long time, unnecessary, but also the three dimensional configuration and the wiring pattern of the MID substrate are integrally formed by injection molding. As a result, productivity can be improved.

In the second aspect, this invention provides a pyroelectric IR-sensor comprising a pyroelectric light receiving element, a substrate including element supporting portions for supporting the ends of the pyroelectric light receiving element with the central portion thereof being spaced from the substrate, having a wiring pattern formed on the surface thereof, and comprised of a ceramic having a thermal conductivity that is less than 0.02 cal/cm.sec.°C., and chip parts mounted on the substrate.

In the above-described pyroelectric IR-sensor, the thermal conductivity of the substrate is less than 0.02 cal/cm.sec.°C., which is less than one third of that of the conventional alumina sensor. Further, the pyroelectric light receiving element and the substrate are connected to each other only at both ends of the pyroelectric light receiving element. Accordingly, even if the pyroelectric light receiving element is directly supported by the element supporting portions of the substrate, it can be sufficiently thermally isolated.

Thus, it becomes unnecessary to form spacing pads and there is no possibility that unevenness in the characteristic or noise due to an unbalanced voltage may occur. In addition, since the processing step which requires a relatively long time is unnecessary, productivity can be improved.

BRIEF DESCRIPTION OF THE DRAWINGS

FIG. 4 is a spread perspective view showing a pyroelectric IR-sensor according to another embodiment of this invention.

FIG. 5 is a flowchart showing a method of manufacturing the pyroelectric IR-sensor shown in FIG. 4.

DESCRIPTION OF THE PREFERRED EMBODIMENTS

This invention will now be described in more detail in accordance with preferred embodiments. It is to be noted that this invention is not limited to these embodiments.

Figure 1:
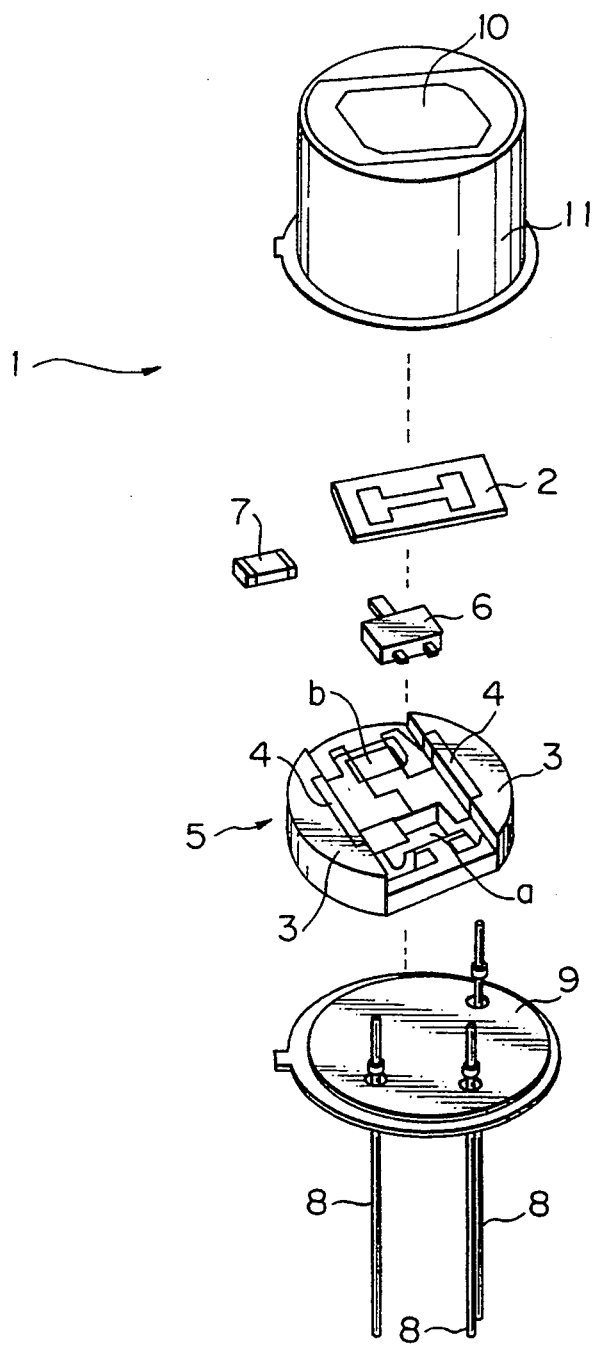
FIG. 1 is an exploded perspective view showing a pyroelectric IR-sensor according to one embodiment of this invention.

In a pyroelectric IR-sensor 1 according to the embodiment of this invention shown in FIG. 1, a pyroelectric light receiving element 2 is of the conventional dual-element type.

An MID substrate 5 is prepared as follows. First, a catalytic resin is used to injection-mold a catalytic resin portion having a surface that serves as a wiring pattern. Then, a non-catalytic resin is used to injection-mold a non-catalytic resin portion having a surface that serves as an insulating surface so that it overlaps the catalytic resin portion. Further, a conductive layer is formed on the surface of the catalytic resin portion by electroless plating, thus allowing the conductive layer to be a wiring pattern 4. It is preferable that both the catalytic resin and the non-catalytic resin have a thermal conductivity as small as possible, and a heat-resisting property as high as possible.

The MID substrate 5 is concave so that both end portions of the pyroelectric light receiving element 2 can be supported with the central portion thereof spaced therefrom.

This MID substrate 5 is mounted on a base 9. Further an FET chip 6 is mounted on the portion a and a resistor chip 7 is mounted on the portion b of the MID substrate 5.

These components are soldered by solder paste/reflow.

Further, the two end portions of the pyroelectric light receiving element 2 are bonded to the element supporting portions 3 and 3 of the MID substrate 5. It is preferable that this bonding is effected by using a conductive epoxy bonding agent in order to suppress heat conduction.

Finally, the article thus obtained is sealed by a case 11 having an optical filter 10 as a window, and the case is filled with $N_2$ gas.

Figure 2:
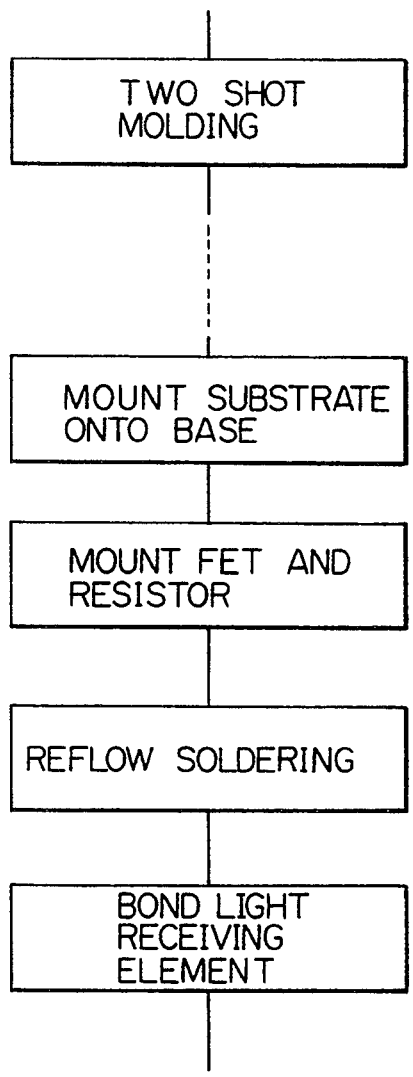
FIG. 2 is a flowchart showing a method for manufacturing the pyroelectric IR-sensor shown in FIG. 1.

FIG. 2 is a flowchart showing the basic part of the method of manufacturing the above-mentioned pyroelectric IR-sensor 1.

Figure 3:
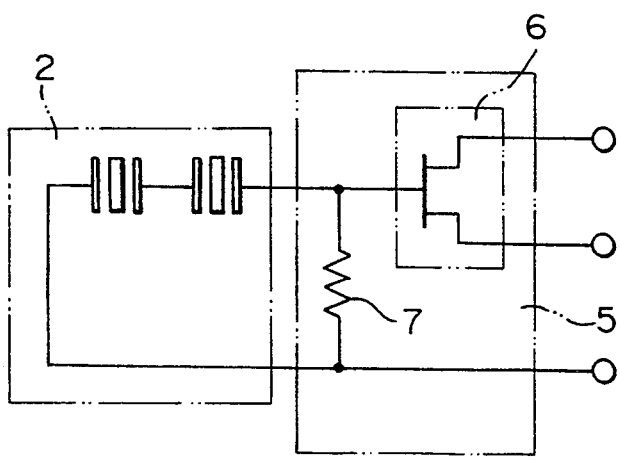
FIG. 3 is an electric circuit diagram of the pyroelectric IR-sensor shown in FIG. 1.

FIG. 3 is an electric circuit diagram thereof.

The following advantages can be provided by the pyroelectric IR-sensor 1.

(1) Since a structure is employed such that the pyroelectric light receiving element 2 is directly supported by the MID substrate 5, the process for forming a spacing pad is unnecessary and the manufacturing process is simplified. Further, the mechanical strength is improved, so the pyroelectric light receiving element can tolerate impact or vibrations.

(2) Since a structure is employed such that only the ends of the pyroelectric light receiving element 2 are supported by a resin having a low thermal conductivity, the thermal isolation becomes satisfactory and unevenness in the characteristics of the device are reduced. Further, the possibility that noise due to an unbalanced voltage may be produced is eliminated.

FIG. 4 shows a pyroelectric IR-sensor 21 according to another embodiment of this invention.

In this pyroelectric IR-sensor 21, the pyroelectric light receiving element 2 is of the conventional type.

The substrate 25 is made of a ceramic having a thermal conductivity lower than 0.02 cal/cm.sec.°C. For such a material (MgCa) $TiO_3$ ceramics having a thermal conductivity of 0.017 cal/cm.sec.°C., a specific dielectric constant of 20, and a specific resistance value more than $10^{13}$ Ωcm, or $BaO$-$SiO_2$-$Al_2O_3$ ceramics having a thermal conductivity of 0.004 cal/cm.sec.°C., a specific dielectric constant of 6, and a specific resistance value more than $10^{13}$ Ωcm may be used. It is preferable that the thermal conductivity and the specific dielectric constant are as small as possible, and the resistance (volume resistivity) is as high as possible.

The substrate 25 is concave so that the end portions of the pyroelectric light receiving element 2 can be supported by element supporting portions 23 and 23 with central portion thereof being spaced from the substrate 25.

Further, a wiring pattern 24 of a silver electrode is formed on the surface of the substrate 25 by using a pad type transfer printing. Since wiring pattern 24 can be formed on a three-dimensional body by a single step by using pad type transfer printing, the manufacturing process is simplified.

This substrate 25 is mounted on a base 9. In addition, an FET chip 6 is mounted on the portion c and a resistor chip 7 is mounted on the portion d of the substrate 25.

These components are soldered by solder paste/reflow.

Further, the two end portions of the pyroelectric light receiving element 2 are bonded to element supporting portions 23 and 23 of the substrate 25. It is preferable that this bonding is effected using a conductive epoxy bonding agent in order to suppress heat conduction.

Finally, the article thus obtained is sealed by a case 11 having an optical filter 10 as a window and the case 11 is filled with $N_2$ gas.

FIG. 5 is a flowchart showing the basic part of the method of manufacturing the above-mentioned pyroelectric IR-sensor 21.

The electric circuit diagram in this embodiment is the same as that shown in FIG. 3.

The following advantages can be provided by the above-mentioned pyroelectric IR-sensor 21.

(1) Since a structure is employed such that the pyroelectric light receiving element 2 is directly supported by the MID substrate 25, the process for forming spacing pads becomes unnecessary and the manufacturing process is simplified. Further, the mechanical strength is improved, so the pyroelectric light receiving element can tolerate impact or vibrations.

(2) Since a structure is employed such that a ceramic substrate 25 having a low thermal conductivity is used to support the pyroelectric light receiving element 2 only by the end portions of the substrate 25, the thermal isolation is satisfactory and unevenness in the characteristics of the device are reduced. Further, the possibility that noise due to an unbalanced voltage may be produced is eliminated.

Although the present invention has been fully described by way of example with reference to the accompanying drawings, it is to be understood that various changes and modifications will be apparent to those skilled in the art. Therefore, unless such changes and modifications depart from the scope of the invention, they should be construed as being included therein.

What is claimed is:

1. A method for forming a pyroelectric sensor comprising:

forming an MID substrate with a first surface and a pair of spaced apart raised mounting projections extending from said first surface by injection molding a catalytic resin portion;

injection molding a non-catalytic resin to overlap said catalytic resin portion;

forming a conductive circuit on said first surface and said projections;

affixing opposite ends of a pyroelectric light receiving element to the conductive circuit on separate ones of said pair of projections, whereby a center portion of said element between said opposite ends is supported spaced from said first surface.

2. A method for forming a pyroelectric sensor comprising:

forming a ceramic substrate with a concave surface having opposed spaced apart element supporting surfaces;

forming an electric circuit on said concave surface and said element supporting surfaces; and affixing opposite ends of a pyroelectric light receiving element to the electric circuit on separate ones of said pair of projections, whereby a center portion of said element between said opposite ends is supported spaced from said concave surface.

* * * * *